United States Patent [19]

Bowen

[11] 4,320,402
[45] Mar. 16, 1982

[54] MULTIPLE RING MICROSTRIP ANTENNA

[75] Inventor: Edwin D. Bowen, Ramona, Calif.

[73] Assignee: General Dynamics Corp./Electronics Division, San Diego, Calif.

[21] Appl. No.: 166,102

[22] Filed: Jul. 7, 1980

[51] Int. Cl.³ .................... H01Q 1/38; H01Q 13/18
[52] U.S. Cl. .................. 343/700 MS; 343/769
[58] Field of Search .............. 343/700 MS, 769, 770, 343/829, 830

[56] References Cited

U.S. PATENT DOCUMENTS

| | | | |
|---|---|---|---|
| Re. 29,911 | 2/1979 | Munson | 343/700 |
| 2,791,769 | 5/1957 | Lindenblad | 343/770 |
| 2,996,610 | 8/1961 | Relis | 250/17 |
| 3,016,536 | 1/1962 | Fubini | 343/801 |
| 3,475,755 | 10/1969 | Bassen et al. | 343/705 |
| 3,478,362 | 11/1969 | Ricardi et al. | 343/769 |
| 3,665,480 | 5/1972 | Fassett | 343/754 |
| 3,680,136 | 7/1972 | Collings | 343/746 |
| 3,707,711 | 12/1972 | Cole et al. | 340/280 |
| 3,739,386 | 6/1973 | Jones, Jr. | 343/708 |
| 3,803,623 | 4/1974 | Charlot, Jr. | 343/846 |
| 3,810,183 | 5/1974 | Krutsinger et al. | 343/708 |
| 3,823,404 | 7/1974 | Buie, Jr. | 343/708 |
| 3,971,125 | 7/1976 | Thies, Jr. | 29/601 |
| 4,012,741 | 3/1977 | Johnson | 343/700 |
| 4,053,895 | 10/1977 | Malagisi | 343/700 |
| 4,054,874 | 10/1977 | Oltman, Jr. | 343/700 |
| 4,079,268 | 3/1978 | Fletcher et al. | 307/700 |
| 4,125,837 | 11/1978 | Kaloi | 343/700 |
| 4,125,838 | 11/1978 | Kaloi | 343/700 |
| 4,125,839 | 11/1978 | Kaloi | 343/700 |
| 4,131,892 | 12/1978 | Munson et al. | 343/700 |
| 4,131,893 | 12/1978 | Munson et al. | 343/700 |
| 4,160,976 | 7/1979 | Conroy | 343/700 |
| 4,163,236 | 7/1979 | Kaloi | 343/700 |
| 4,170,012 | 10/1979 | Kaloi | 343/700 |
| 4,208,660 | 6/1980 | McOwen | 343/769 |

Primary Examiner—Eli Lieberman
Attorney, Agent, or Firm—Brown & Martin

[57] ABSTRACT

A broadband microstrip antenna including two overlapping PC boards. A plurality of concentric spaced apart radiating rings and an upper ground plane layer are etched in the conductive upper surface of the upper PC board. An RF feedline network is etched in the conductive lower surface of the upper PC board. A continuous ground plane layer overlies the lower surface of the lower PC board. Plated through holes in the upper PC board connect a pair of 90° spaced feed points on each of the rings to the feedline network. The feedline network is made of a plurality of conductive strips and matching stubs which are dimensioned and interconnected to permit the transmission/reception of circular polarized RF electromagnetic radiation while also matching the impedance of the rings to the impedance of a plurality of coaxial connectors mounted to the lower PC board.

11 Claims, 6 Drawing Figures

MULTIPLE RING MICROSTRIP ANTENNA

BACKGROUND OF THE INVENTION

The present invention relates to microstrip antennas, and more particularly, to a microstrip antenna having an improved bandwidth capability.

In general, antenna design is dependent upon the desired functional capabilities such as transmitting-/receiving linearly polarized, right-hand circularly polarized, left-hand circularly polarized, etc., RF signals with the required gain, bandwidth, etc. Frequently it is desirable for an antenna to remain light in weight, simple in construction and unobtrusive where the antenna is to be mounted upon another structure such as a high velocity aircraft, or missile which cannot tolerate excessive deviations from aerodynamic shapes.

A microstrip antenna formed by etching a single side of a unitary metallically clad dielectric sheet (PC board) utilizing conventional photoresist etching techniques is generally recognized as a design which can be really adapted to meet the aforementioned desirable characteristics. Such an antenna may be only 1/32 inch to ⅛ inch thick and may be manufactured at minimum cost with maximum reproducibility and operating reliability. The cost to the customer is minimized since single antenna elements and/or arrays of such elements together with appropriate RF feedlines, phase shifting circuits, multiplexers, and/or impedance matching networks may all be manufactured as integrally formed electrical circuits utilizing low cost photoresist etching processes.

Numerous microstrip antennas have been developed which are advantageously suited to transmit/receive RF radiation having predetermined polarizations such as linear polarization and left-hand or right-hand circular polarization. Many of these have been designed for use in an overall array comprising a plurality of such individual microstrip antenna elements which are phased relative to one another to provide high gain fan beam or pencil beam radiation patterns when disposed in flat or even curved configurations. The necessary relative phase shifts for such microstrip antenna arrays can be economically achieved with phase shifting circuitry that is integrally formed in the PC boards by photoresist etching techniques. The fan or pencil beam of radiation may also be controllably steered by controlling switchable diodes or other controlled elements mounted directly on the microstrip structure in combination with appropriate integrally formed phase shifting circuits, etc.

Linearly polarized RF electromagnetic radiation may be produced by simply feeding the RF signal energy to one point along one side of a square shaped or rectangularly shaped microstrip radiator. Circularly polarized RF electromagnetic radiation may be produced by driving adjacent sides of a square microstrip radiator with signals having relative phasing of 90° to produce the required conjugate phasing of the radiated fields. Either left-hand or right-hand circularly polarized signals may be produced. Other microstrip radiator elements may be driven to produce circularly polarized RF electromagnetic radiation. For example, a circular shaped microstrip radiator driven at points separated by 90° relative phase angles will also produce the desired circularly polarized radiation.

Whether a microstrip antenna is adapted for use with linearly polarized radiation or circularly polarized radiation, the necessary RF feedlines, phase shifters, and/or impedance matching networks are usually integrally formed by conventional photolithographic techniques along with the radiating elements. Generally the dimensions of the RF feedlines are designed according to conventional impedance matching techniques to match the antenna impedance to the impedance of the anticipated coaxial cable or other RF conduits connected to the RF feedlines on the microstrip antenna structure.

While a wide variety of microstrip antennas have been developed, generally their operating frequency bandwidth is relatively small. Typically it is one or two percent when calculated by taking the difference between the upper and lower frequencies between which attenuation is not more than 3.0 decibels greater than its average attenuation through its passband and dividing that difference by the center frequency of the passband. It would be desirable to provide an improved broadband microstrip antenna having an operating frequency bandwidth substantially greater than the normally attained one or two percent values.

U.S. Pat. No. Re 29,911 discloses in FIG. 4 a circularly polarized microstrip antenna including a circular radiating element connected to a quadrature feedline impedance matching network. U.S. Pat. No. 3,665,480 discloses in FIGS. 1 and 2 a microstrip antenna including two overlapping dielectric layers, a front conducting plate on the upper surface of one of the layers, a back conducting plate on the bottom surface of the other one of the layers, an annular slot, and conductive feedlines extending between the conductive layers. U.S. Pat. No. 3,739,386 discloses various antennas including concentric slotted radiating elements. U.S. Pat. Nos. 2,996,610; 3,475,755; and 3,810,183 disclose other forms of non-microstrip antennas including ring-shaped radiating elements. Representative of the microstrip antenna field are U.S. Pat. Nos. 3,803,623; 3,971,125; 4,012,741; 4,053,895; 4,054,874; 4,079,268; 4,125,837; 4,125,838; 4,125,839; 4,160,976; 4,163,236; and 4,170,012. Also of general interest in this field, although generally of less pertinence than the patents already listed, are U.S. Pat. Nos. 3,016,536; 3,478,362; 3,680,136; 3,707,711; 3,823,404; 4,131,892; and 4,131,893.

SUMMARY OF THE INVENTION

It is therefore a primary object of the present invention to provide an improved broadband microstrip antenna.

In one illustrated embodiment the antenna comprises two overlapping PC boards. A plurality of concentric spaced apart radiating rings and an upper ground plane layer are etched in the conductive upper surface of the upper PC board. An RF feedline network is etched in the conductive lower surface of the upper PC board. A continuous ground plane layer overlies the lower surface of the lower PC board. Plated through holes in the upper PC board connect a pair of 90° spaced feed points on each of the rings to the feedline network. The feedline network is made of a plurality of conductive strips and matching stubs which are dimensioned and interconnected to permit the transmission/reception of circular polarized RF electromagnetic radiation while also matching the impedance of the rings to the impedance of a plurality of coaxial connectors mounted to the lower PC board. Broadband capability can be obtained by dimensioning the rings so that the passband of each of the rings which is bounded by 3.0 decibel downpoints overlaps a portion of a similarly measured passband of an adjacent one of the rings.

BRIEF DESCRIPTION OF THE DRAWINGS

The relative dimension in the figures are not to scale. Like reference numerals throughout the figures refer to like parts.

DESCRIPTION OF THE PREFERRED EMBODIMENTS

It is well known that antennas are reciprocal insofar as their transmitting and receiving characteristics are concerned. Therefore, when the construction or operation of a particular embodiment is described herein in terms of one of these modes of operation it will be understood that the antenna possesses similar characteristics in the other mode of operation.

Figure 1:
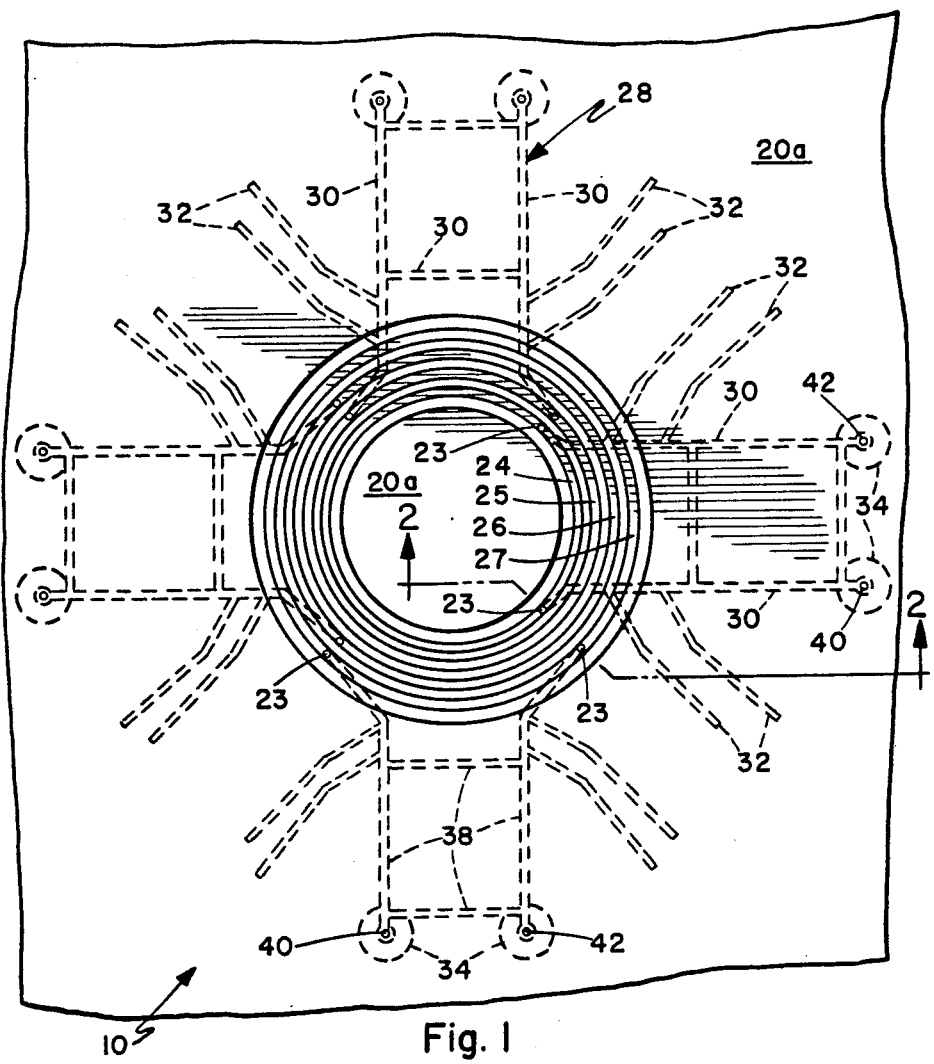
FIG. 1 is a plan view of one embodiment of the present invention.
Figure 2:
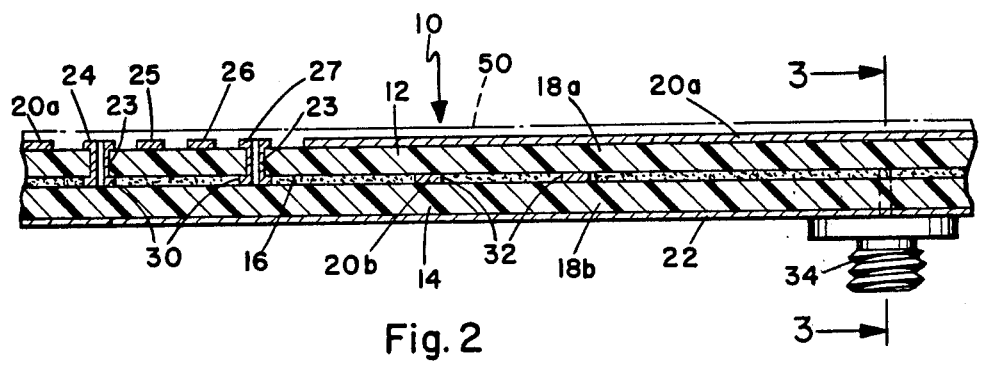
FIG. 2 is an enlarged fragmentary sectional view taken along line 2—2 of FIG. 1.

Referring to FIGS. 1 and 2, there is illustrated therein one embodiment 10 of a broadband microstrip antenna. It includes upper and lower PC boards 12 and 14 (FIG. 2) which are held together in overlapping fashion by a layer 16 of a suitable adhesive material therebetween. The upper and lower PC boards include respective sheets 18a and 18b of a suitable dielectric material. Clad to both the upper and lower sides of the dielectric sheet 18a of the upper PC board are thin layers 20a and 20b, respectively, made of a suitable electrically conductive material. Clad to the lower surface of the dielectric sheet 18b of the lower PC board is a thin layer 22 of a suitable electrically conductive material.

The dielectric sheets 18a and 18b of the PC boards are preferably made of a lightweight, strong material having a sufficiently high dielectric constant. One suitable dielectric material is a composite of fluorinated ethylene propylene (sold under the trademark TEFLON) and glass fibers. One suitable electrically conductive material for the PC boards is copper. Preferably the layers of copper 20a, 20b and 22 which are bonded to the dielectric sheets are relatively thin, e.g. approximately 1.4 mils thick. Other dielectric and electrically conductive materials may be utilized.

When the upper PC board 12 is fabricated, a plurality of plated through holes 23 (FIGS. 1 and 2) are formed at preselected locations. As hereafter described these plated through holes connect different rings etched in the upper surface 20a to a feedline network etched in the lower surface 20b.

Prior to assembling the upper and lower PC boards in overlapping relationship, the upper and lower electrically conductive surfaces of the upper PC board are etched using conventional photoresist etching techniques to delinate the components of the microstrip antenna. Specifically, the upper conductive surface 20a of the upper PC board is etched to provide a plurality of thin, concentric, spaced apart radiating rings 24–27 (See FIGS. 1 and 2). The lower conductive surface 20b of the upper PC board is etched to produce a feedline network 28 (FIG. 1) made of a plurality of conductive strips 30 and matching stubs 32. The strips and stubs are dimensioned and interconnected with each other and with the rings 24–27 as hereafter described in order to permit the transmission/reception of circular polarized RF electromagnetic radiation while also matching the impedance of the rings to the impedance of a plurality of coaxial connectors 34 (FIG. 2) mounted to the lower PC board. The conductive lower surface 22 of the lower PC board 14 functions as a continuous ground plane layer.

The rings 24–27 are dimensioned, i.e. their diameters and widths are delineated, so that their individual operating frequencies are matched to adjacent sectors of the overall operating frequency range of the antenna 10 as a whole. Specifically the rings 24–27 are preferably dimensioned so that each passband of each one of the rings overlaps a portion of the passband of an adjacent one of the rings. By way of example, the width of the rings may range from approximately 0.05 inches to approximately 0.200 inches and the outside diameter of the rings may range from approximately 2.0 inches to approximately 5.0 inches. As used herein in reference to a ring the term passband refers to the operating frequency range of a ring with respect to the transmission or reception of electromagnetic radiation throughout which attenuation is not more than 3.0 decibels. Putting it another way, passband refers to the operating frequency range of a ring which is bounded by 3.0 decibel downpoints.

In the embodiment illustrated in FIGS. 1 and 2, the feedline network 28 is configured and connected to the radiating rings to permit the transmission/reception of circular polarized RF electromagnetic radiation. The plated through holes 23 in the upper PC board 12 are utilized to electrically connect a pair of 90° spaced feed points on each of the rings 24–27 to a corresponding separate portion of the feedline network 28 as best seen in FIG. 1.

The radiating mode and polarization of each of the rings 24–27 is controlled by the number of feed points. While two feed points for each ring have been illustrated in FIG. 1, either one, two, or four feed points can be used to achieve a broadside (Mode 1) radiation pattern or a monopole type (Mode 2) radiation pattern and either linear or circular radiated polarization. While four rings have been illustrated in FIGS. 1 and 2, any number of concentric rings can be placed on the upper surface of the upper PC board. While the rings are shown as being circular, they may be square, rectangular, elipsodial, or some other shape. The feed points of the radiating rings 24–27 may be connected to the feedlines or strips 30 etched on the lower surface of the upper PC board by plated through holes as shown or by soldered wire connections. Preferably the upper surface of the lower dielectric sheet 18b is substantially uniformly spaced from the lower surface of the upper dielectric sheet 18a. This insures that the ground planes, feedline network, and rings will all be parallel.

In the embodiment illustrated in FIG. 1, the orthogonal feed points of each of the rings are combined into a quadrature hybrid 38. The sense of rotation of the circularly polarized RF signal is opposite at the two hybrid output terminals 40 and 42 when the antenna is utilized as a receiver.

Referring again to FIG. 2, the portion of the conductive upper surface 20a of the upper PC board which extends outwardly from the rings and above a major portion of the feedline network 28 functions as an upper ground plane layer. The conductors which thus extend between the upper and lower ground planes are in effect striplines. This arrangement prevents the feedline network 28 from radiating a substantial amount of RF energy while at the same time it decreases the radar cross section of the antenna. The radiating rings will still operate as microstrip elements even without the upper ground plate. However, in order to operate effectively this arrangement would require more stringent matching of the feedline network impedance to the impedance of the rings.

Figure 3:
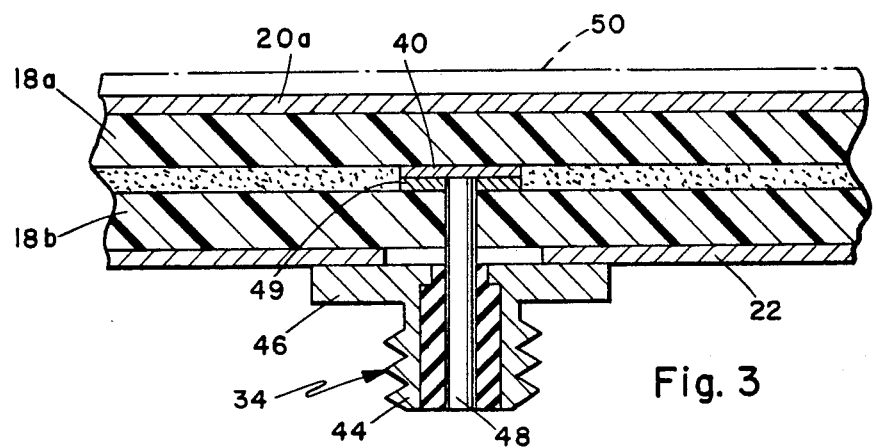
FIG. 3 is an enlarged view of a portion of FIG. 2.

The coaxial connectors 34 are mounted to the lower ground plane layer 22 adhered to the lower surface of the lower PC board 14 (see FIGS. 2 and 3). Two such coaxial connectors are required for electrically connecting the output terminals such as 40 and 42 (see FIG. 1) of each separate portion of the feedline network 28 to the orthogonal feed points of the corresponding radiating ring. The coaxial connectors 34 (FIG. 3) may each have a conventional construction including an externally threaded cylindrical sleeve 44 connected to an annular base 46 which is in electrical contact with the lower ground plane layer 22. Each of the connectors 34 may further include a central pin such as 48 which is electrically isolated from the ground plane, the sleeve 44 and the base 46. The pin extends through the lower PC board 14. Its head 49 is in electrical contact with the corresponding output terminal such as 40 (FIG. 1) of the feedline network to which it pertains.

According to well known design rules, the strips 30 and matching stubs 32 (FIG. 1) of the feedline network 28 can be dimensioned and interconnected to substantially match the impedance of the ring to which they are connected to the impedance of the corresponding one of the coaxial connectors 34. The dual matching stubs 32 match the high impedance of a given ring to the relatively low impedance, e.g. approximately 50 ohms, of the strips 30. The coaxial connectors are readily connectable to coaxial cable of matching impedance leading to an external discrete component multiplexer and thence to a suitable RF signal transmitter, RF signal receiver, or combined RF signal transmitter and receiver. As used herein the term "transceiver" includes transmitter apparatus utilizing common functional components.

In operation, the individual passbands of each of the radiating rings 24-27 are all summed into a single port. For this purpose, a comb filter mutliplexer made of stripline components (not shown) etched in the conductive surface 20b may be interconnected between the radiating rings and the transceiver according to well known techniques in the antenna field. Broadband capability is achieved as a result of the overlapping passbands of the individual radiating rings. Significant improvements in the overall operating frequency bandwidth of a microstrip antenna from the normally obtained one or two percent to values of eight percent or greater can be achieved through this technique. The frequency tuning of each ring is adjusted by the matching components of the feedline network to provide piecewise continuity across a broad frequency band. The phase paths are equalized to produce a stationary phase center on the antenna over the useful overall bandwidth thereof.

The antenna illustrated in FIGS. 1 and 2 retains all of the desirable characteristics of a microstrip antenna. These are essentially; thin construction that permits conformal flush or low profile mounting; inexpensive fabrication cost; high reliability; and decreased radar cross section, sometimes referred to as RCS. If desired, a protective cover or layer 50 (shown in phantom lines FIG. 2) may be formed over the radiating rings and the conductive upper surface 20a of the upper PC board. This layer may be made of the composite material previously referred to. It protects the radiating rings from physical damage, and increases resistance to corona, static discharge, and dielectric breakdown.

The antenna illustrated in FIGS. 1 and 2 can sustain medium power levels for both transmitting and receiving applications. It can be mounted conformally on an aircraft or missle. It can further be utilized on the reflective surfaces of multifunction apertures, e.g. in connection with a parabolic dish reflector. The antenna can also be utilized as an element in a phased array.

Figure 4:
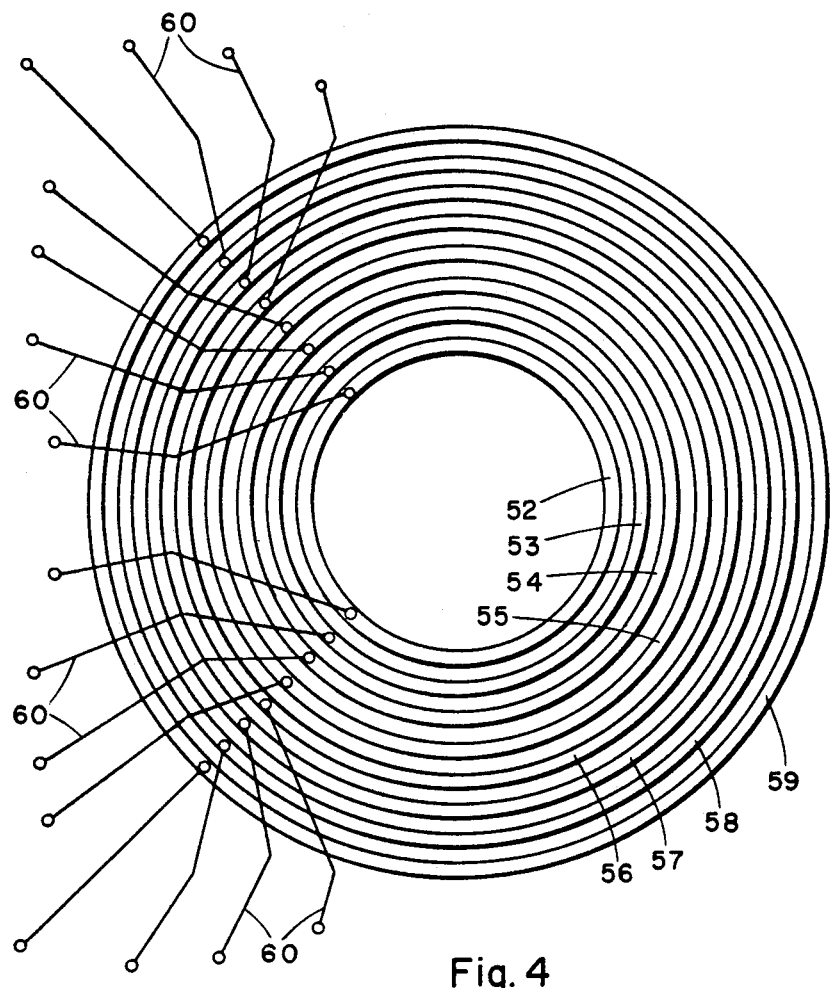
FIG. 4 is a simplified plan view of a second embodiment of the present invention.

As previously mentioned the antenna of the present invention can have different numbers of radiating rings, depending upon the desired overall operating frequency bandwidth desired. Referring to FIG. 4, there is illustrated therein in simplified form a plan view of a second embodiment of the present invention which includes eight concentric radiating rings 52-59. Each ring is fed at two orthogonal feed points. For simplicity, in FIG. 4, eight pairs of feedlines 60, one pair corresponding to each of the radiating rings, have been illustrated. The matching stubs connected to each of the feedlines have not been shown. The design and construction of the antenna illustrated in FIG. 4 is otherwise similar to that discussed in connection with the embodiment illustrated in FIGS. 1 and 2.

Figure 5:
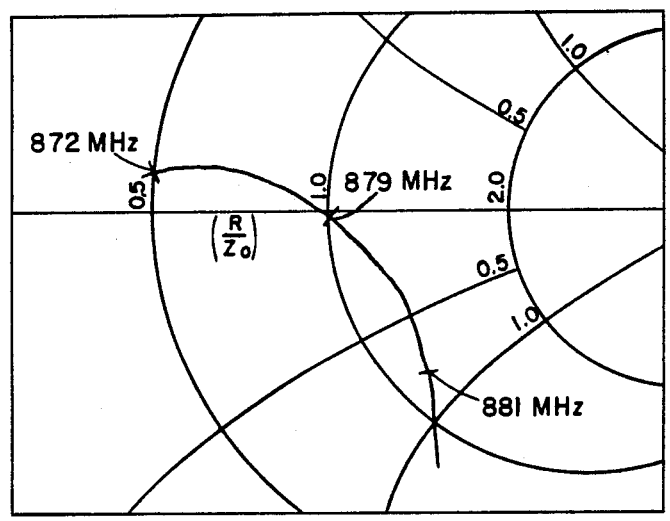
FIGS. 5 and 6 are each graphs of data on a Smith chart illustrating the improved broadband capability which can be achieved by constructing a microstrip antenna in accordance with the present invention.

Experiments were conducted in order to confirm the bandwidth capability of the present invention. FIG. 5 illustrates the impedance plot of a single ring microstrip antenna. The plot shown is the center section of a Smith chart with a 50 ohm center impedance. The swept frequency measurement of the impedance displays a bandwidth between 2:1 VSWR points of 9 megahertz (MHZ) which corresponds to approximately one percent. The microstrip antenna whose operating characteristics are plotted in FIG. 5 included two impedance matching stubs on each of the feedlines.

Figure 6:
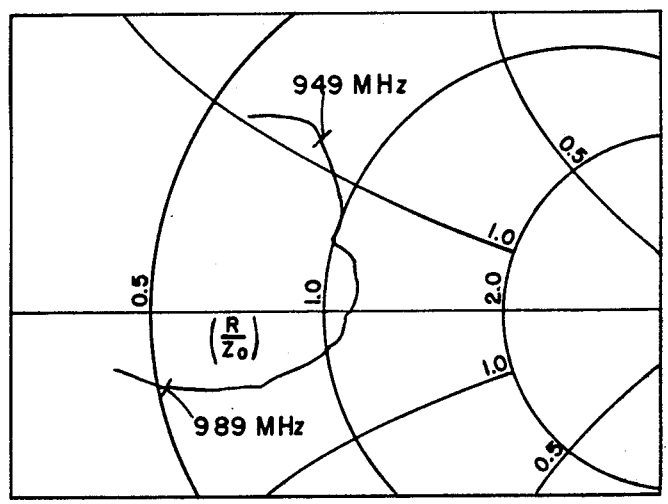

FIG. 6 illustrates the impedance plot of the operating characteristics of a second antenna incorporating three concentric rings dimensioned in accordance with the teachings of th present invention. Only two of the rings were connected to matching networks and output connections. Dual open stub feedlines were used to match each ring to a frequency band adjacent to that of an adjacent ring in order to obtain bandwidth improvement. The 2:1 VSWR bandwidth of this antenna was nearly four percent.

Having described preferred embodiments of the present invention, it should be apparent to those skilled in the art the invention permits of further modification in both arrangement and detail. For example, the antenna could be constructed in connection with curved PC boards. The frequency bands for each individual radiating ring need not be placed adjacent to each other and instead the antenna can be operated simultaneously at separated frequencies. Therefore, the present invention should be limited only in accordance with the scope of the following claims.

I claim:

1. A microstrip antenna comprising:
   a first sheet made of a dielectric material and having an upper surface and a lower surface;

a plurality of concentric, spaced apart radiating rings made of an electrically conductive material overlying the upper surface of the first dielectric sheet;

RF feedline means overlying the lower surface of the first dielectric sheet for conducting RF signal energy to/from the rings;

means for providing direct electrical connections between the rings and the RF feedline means;

a second sheet made of a dielectric material and having an upper surface and a lower surface, the upper surface of the second dielectric sheet being adjacent to the lower surface of the first dielectric sheet;

a lower ground plane layer made of an electrically condutive material overlying the lower surface of the second dielectric sheet; and the rings being dimensioned so that the passband of each one of the rings bounded by approximately 3.0 decibel downpoints overlaps a portion of the passband of an adjacent one of the rings bounded by approximately 3.0 decibel downpoints.

2. A microstrip antenna according to claim 1 and further comprising coaxial connector means mounted to the lower ground plane layer for electrically connecting the RF feedline means to a transceiver.

3. A microstrip antenna according to claim 2 wherein the RF feedline means includes a plurality of strips made of an electrically conductive material which are dimensioned and interconnected to substantially match the impedance of the rings to the impedance of the coaxial connector means.

4. A microstrip antenna according to claim 1 wherein RF feedline means is configured and connected to the rings to permit the transmission/reception of circular polarized RF electromagnetic radiation.

5. A microstrip antenna according to claim 1 and further comprising a layer of a dielectric material overlying the rings and the upper surface of the first dielectric sheet.

6. A microstrip antenna according to claim 4 and further comprising:

coaxial connector means mounted to the lower ground plane layer for electrically connecting the RF feedline means to a transceiver; and further wherein the RF feedline means includes a plurality of strips made of an electrically conductive material which are dimensioned and interconnected to substantially match the impedance of the rings to the impedance of the coaxial connector means.

7. The microstrip antenna according to claims 3 or 6 wherein the RF feedlines means further includes a plurality of matching stubs made of an electrically conductive material which are connected to the strips.

8. A microstrip antenna according to claim 1 wherein the first and second dielectric sheets are made of a composite material made of fluorinated ethylene propylene and glass fibers.

9. A microstrip antenna according to claim 3 wherein the rings and the strips are made of copper and have a thickness of approximately 1.4 mils.

10. A microstrip antenna according to claim 1 and further comprising an upper ground plane layer made of an electrically conductive material overlying the upper surface of the first dielectric sheet downwardly from the rings and above a major portion of the feedline means.

11. A microstrip antenna according to claim 1 wherein the means for providing direct electrical connections between the rings and the RF feedline means comprises a plurality of plated through holes.

* * * * *